(12) United States Patent
Lee et al.

(10) Patent No.: US 7,892,878 B2
(45) Date of Patent: Feb. 22, 2011

(54) ORGANIC LIGHT EMITTING DEVICE AND METHOD OF MANUFACTURING THE SAME

(75) Inventors: Tae-woo Lee, Seoul (KR); Tae-yong Noh, Seoul (KR); Haa-jin Yang, Yongin-si (KR); Byoung-ki Choi, Hwaseong-si (KR); Myeong-suk Kim, Hwaseong-si (KR); Dong-woo Shin, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 14 days.

(21) Appl. No.: 12/481,257

(22) Filed: Jun. 9, 2009

(65) Prior Publication Data
US 2010/0019232 A1      Jan. 28, 2010

(30) Foreign Application Priority Data
Jul. 24, 2008     (KR) ........................... 2008-0072437

(51) Int. Cl.
*H01L 21/00*     (2006.01)

(52) U.S. Cl. ..................... 438/82; 438/99; 438/782; 257/E21.053; 257/E21.259; 257/E21.077; 257/E21.352

(58) Field of Classification Search ............ 438/29, 438/69, 82, 99, 311, 509, 608, 782; 257/E21.053, 257/77, 259, 352
See application file for complete search history.

(56) References Cited

U.S. PATENT DOCUMENTS

| | | | |
|---|---|---|---|
| 2006/0083945 A1* | 4/2006 | Morishita et al. | 428/690 |
| 2007/0075628 A1* | 4/2007 | Lewis et al. | 313/503 |

* cited by examiner

*Primary Examiner*—David Nhu
(74) *Attorney, Agent, or Firm*—F. Chau & Associates, LLC

(57) ABSTRACT

Provided are a method of manufacturing an organic light emitting device. The method includes forming an electron injection layer by vacuum co-depositing an organic semiconductor material having an electron mobility of about $1 \times 10^{-6}$ $cm^2/V \cdot s$ or more in an electric field of about $1 \times 10^6$ V/m and a metal azide.

20 Claims, 4 Drawing Sheets

ORGANIC LIGHT EMITTING DEVICE AND METHOD OF MANUFACTURING THE SAME

CROSS-REFERENCE TO RELATED PATENT APPLICATION

This application claims priority from Korean Patent Application No. 10-2008-0072437, filed on Jul. 24, 2008, the disclosure of which is hereby incorporated by reference herein in its entirety.

BACKGROUND OF THE INVENTION

1. Technical Field

The present disclosure relates to an organic light emitting device and to a method of manufacturing an organic light emitting device, and more particularly to an organic light emitting device including an electron injection layer (EIL) formed by vacuum co-depositing an organic semiconductor material having an electron mobility of about $1\times10^{-6}$ cm$^2$/V·s or more in an electric field of about $1\times10^6$ V/m and a metal azide, and to a method of manufacturing the same.

2. Description of the Related Art

Organic light emitting devices typically include a pair of electrodes and an organic layer interposed between the electrodes, and wherein when a current is supplied to the electrodes, electrons and holes injected through the electrodes may be re-combined in the organic layer, thereby emitting light. Accordingly, organic light emitting devices may be self-emission-type devices. Also, organic light emitting devices may be lightweight, and can be readily manufactured using a relatively small number of components. In addition, organic light emitting devices may provide high-quality images and have wide viewing angles. Furthermore, organic light emitting devices may provide high color purity, accurately realize mobile images, have low power consumption, and are operated at low voltage. Due to the above-mentioned characteristics, organic light emitting devices may be suitable for mobile electronic devices.

Moreover, an organic light emitting device typically includes a structure of substrate/anode/organic layer/cathode and the organic layer includes at least one layer selected from the group consisting of a hole injection layer, a hole transporting layer, an exciton blocking layer, an emission layer, a hole blocking layer, an electron transporting layer and an electron injection layer (EIL).

Conventionally, an EIL used in organic light emitting devices can be formed using, for example, LiF, NaCl, CsF, Li$_2$O, BaO, etc. However, there is still a need in the art to develop an electron injectable material for manufacturing an organic light emitting device having desired characteristics.

SUMMARY OF THE INVENTION

In accordance with an exemplary embodiment of the present invention, a method of manufacturing an organic light emitting device is provided. The method includes forming a first electrode on a substrate forming an organic layer on the first electrode and forming a second electrode on the organic layer. The forming of the organic layer comprises forming an electron injection layer (EIL) by vacuum co-depositing an organic semiconductor material having an electron mobility of about $1\times10^{-6}$ cm$^2$/V·s or more in an electric field of about $1\times10^6$ V/m and a metal azide represented by Formula 1:

$$M(N_3)_x \qquad \text{<Formula 1>}$$

where M is selected from the group consisting of an alkali metal, an alkaline earth metal, and a lanthanide-based metal; and x is 1, 2, or 3.

The vacuum co-depositing may be performed at a pressure of about $10^{-10}$ torr to about $10^{-3}$ torr. The vacuum co-depositing may be performed at a temperature of about 350° C. or lower. For example, the melting point of CsN$_3$ may be about 310° C., and an electron transporting material, such as Alq3, TPBI, or Bphen, may be deposited at about 350° C. or lower. The organic semiconductor material may include an electron transporting material or a host that is used in an emission layer.

In accordance with another exemplary embodiment of the present invention, an organic light emitting device is provided. The organic light emitting device includes a substrate, a first electrode, a second electrode and an organic layer interposed between the first electrode and the second electrode. The organic layer comprises a electron injection layer (EIL), wherein the EIL is formed by vacuum co-depositing an organic semiconductor material having an electron mobility of about $1\times10^{-6}$ cm$^2$/V·s or more in an electric field of about $1\times10^6$ V/m and a metal azide represented by Formula 1:

$$M(N_3)_x \text{ where M is selected from the group consisting of an alkali metal, an alkaline earth metal, and a lanthanide-based metal; and x is 1, 2, or 3.} \qquad \text{<Formula 1>}$$

The organic semiconductor material may include an electron transporting material or a host that is used in an emission layer. The EIL may include at least one material selected from the group consisting of: a metal selected from the group consisting of alkali metal, alkaline earth metal, and lanthanide-based metal; a metal oxide selected from the group consisting of alkali metal oxide, alkaline earth metal oxide, and lanthanide-based metal oxide; and a metal azide selected from the group consisting of alkali metal azide, alkaline earth metal azid, and lanthanide-based metal azide.

In accordance with another exemplary embodiment of the present invention, a method of manufacturing an organic light emitting device is provided. The method includes forming a first electrode on a substrate, forming a hole injection layer (HIL) on the first electrode, forming a hole transport layer (HTL) on the HIL, forming an emission layer (EML) on the HIL, forming an electron transport layer (ETL) on the EML, forming an electron injection layer (EIL) on the ETL and forming a second electrode on the EIL. The EIL is formed by vacuum co-depositing an organic semiconductor material having an electron mobility of about $1\times10^{-6}$ cm$^2$/V·s or more in an electric field of about $1\times10^6$ V/m and a metal azide represented by Formula 1:

$$M(N_3)_x \qquad \text{<Formula 1>}$$

where M is selected from the group consisting of an alkali metal, an alkaline earth metal, and a lanthanide-based metal; and x is 1, 2, or 3.

BRIEF DESCRIPTION OF THE DRAWINGS

Exemplary embodiments of the present invention can be understood in more detail from the following description taken in conjunction with the attached drawings in which.

DETAILED DESCRIPTION OF EMBODIMENTS

The present invention will now be described more fully with reference to the accompanying drawings, in which exemplary embodiments of the invention are shown.

An organic light emitting device according to an exemplary embodiment of the present invention may include a first electrode, a second electrode, and an organic layer interposed between the first electrode and the second electrode, wherein the organic layer includes an electron injection layer (EIL). The organic layer may further include, in addition to the EIL, at least one layer selected from the group consisting of a hole injection layer (HIL), a hole transporting layer (HTL), an exciton blocking layer (EBL), an emission layer (EML), a hole blocking layer (HBL), and an electron transporting layer (ETL). Herein, layers are defined as HIL, HTL, EBL, EML, HBL, ETL and EIL using a conventional definition method. However, each layer can perform other functions regardless of its name. For example, according to the type of the selected material, the HTL may have, in addition to the hole transporting capability, a capability of blocking diffusion of excitons generated in the EML. Likewise, according to the type of the selected material, the ETL has, in addition to the electron transporting capability, a hole blocking capability.

Figure 1:
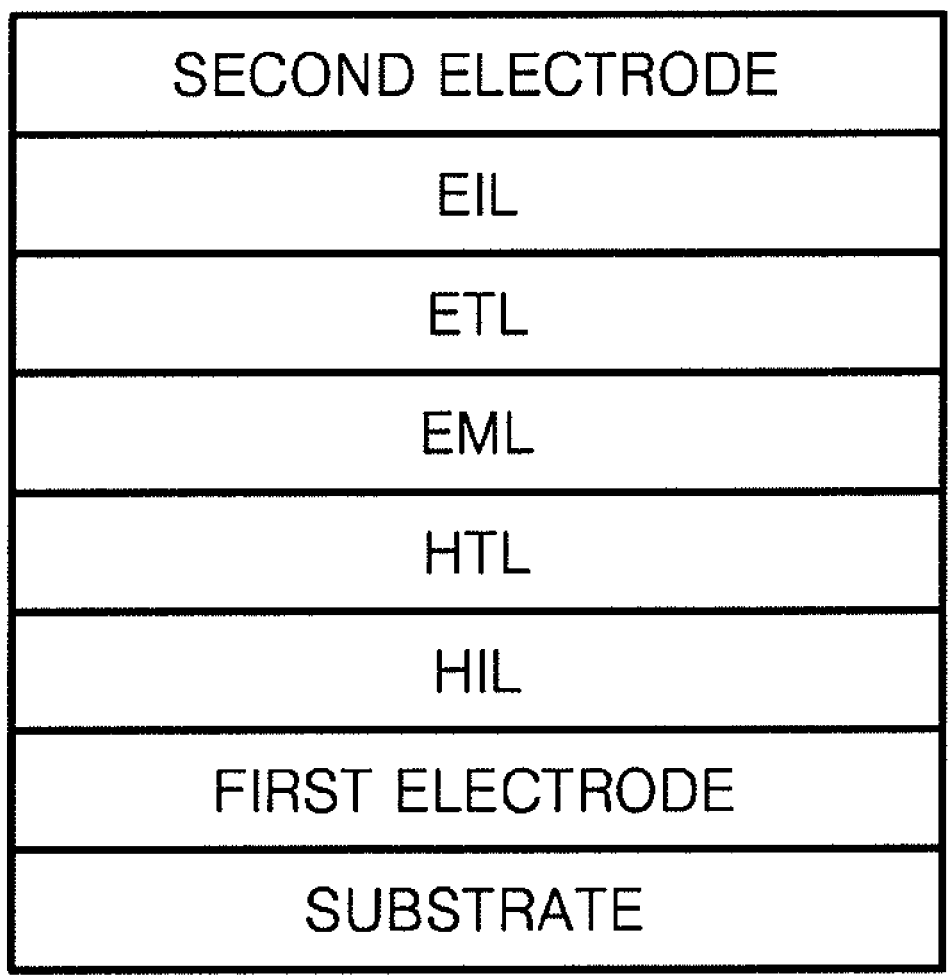
FIG. 1 is a schematic sectional view of an organic light emitting device according to an exemplary embodiment of the present invention.

FIG. 1 is a schematic sectional view of an organic light emitting device according to an exemplary embodiment of the present invention. Hereinafter, a method of manufacturing an organic light emitting device according to an exemplary embodiment of the present invention and an organic light emitting device according to an exemplary embodiment of the present invention will now be described with reference to FIG. 1.

Referring to FIG. 1, the organic light emitting device according to the current exemplary embodiment includes a substrate, a first electrode, a HIL, a HTL, an EML, an ETL, an EIL, and a second electrode.

The substrate may be any substrate that is used in conventional organic light emitting devices. In this regard, the substrate may be, for example, a glass or transparent plastic substrate that has high mechanical strength, thermal stability, a flat surface, and handling convenience, and is transparent and waterproof.

The first electrode may be an anode because the HIL is formed on the first electrode. The anode is a hole injection electrode. The first electrode may be formed by, for example, depositing or sputtering a material having a high work function. Examples of a first electrode forming material may include highly conductive materials, such as indium tin oxide (ITO), indium zinc oxide (IZO), tin oxide ($SnO_2$), or zinc oxide (ZnO). However, the first electrode forming material is not limited to these materials.

The HIL may be formed using any known method, such as, for example, a vacuum-depositing method, a spin-coating method, a casting method, or a Langmuir-Blodgett (LB) deposition method. If the HIL is formed using the vacuum-depositing method, deposition conditions may differ according to the target compound, the target layer structure, and thermal characteristics. In this regard, in general, the deposition temperature may be, for example, about 100 to about 500° C., the vacuum pressure may be, for example, about $10^{-10}$ to about $10^{-3}$ torr, and the deposition rate may be, for example, about 0.01 to about 100 Å/sec. If the HIL is formed using the spin-coating method, coating conditions may differ according to the target compound, the target layer structure, and thermal characteristics. In this regard, in general, the coating rate may be, for example, about 2000 rpm to about 5000 rpm, and the heat treatment temperature at which a solvent used is removed after coating may be, for example, about 80° C. to about 200° C.

A HIL forming material may be any known hole injectable material. Examples of the hole injectable material include a phthalocyanine compound such as copper phthalocyanine, 4,4',4"-tris(3-methylphenylphenylamino)triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylened ioxythiophene)/poly(4-styrenesulfonate) (PEDOT/PSS), polyaniline/camphor sulfonicacid (Pani/CSA), and (polyaniline)/poly(4-styrenesulfonate) (PANI/PSS). However, the HIL forming material is not limited to these materials.

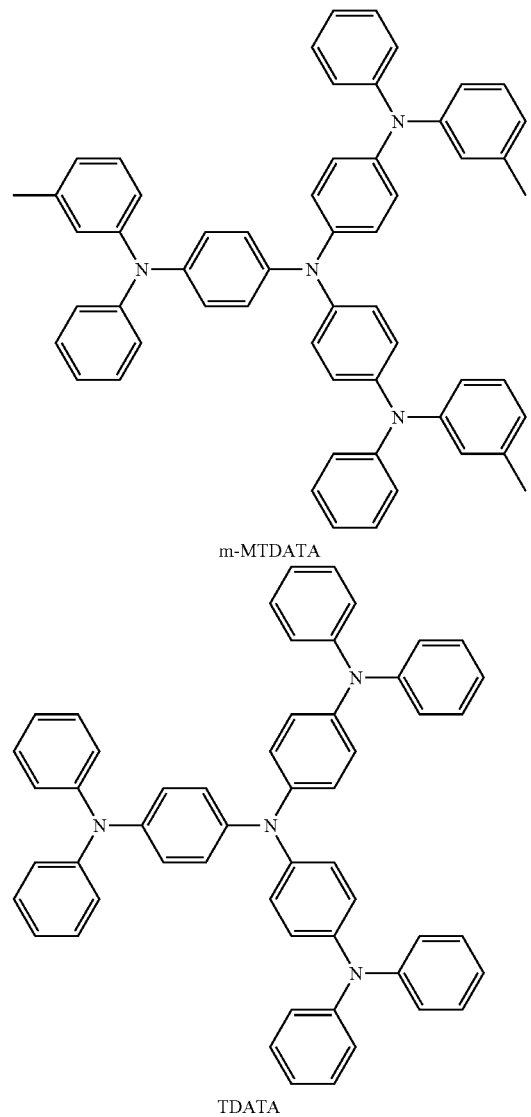

m-MTDATA

TDATA

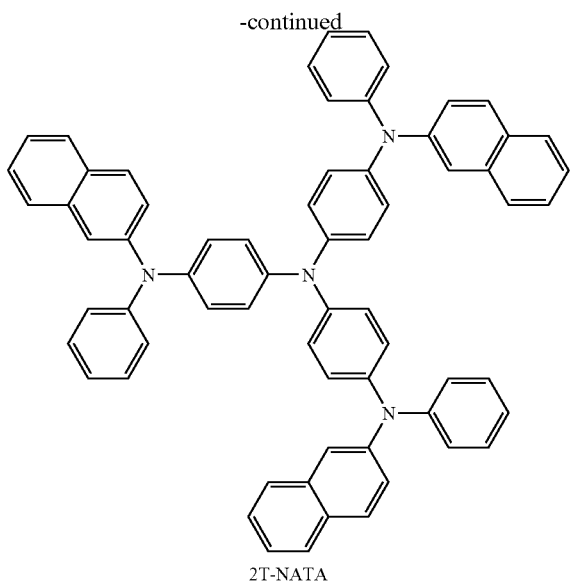

2T-NATA

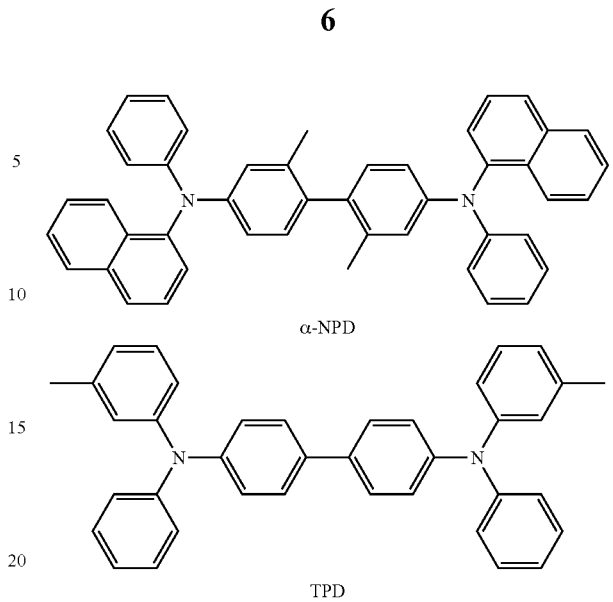

α-NPD

TPD

Meanwhile, to improve hole injection characteristics, the HIL may include, in addition to the hole injectable materials described above, an inorganic metal oxide. Examples of the inorganic metal oxide include, for example, $MoO_3$, $V_2O_5$, and $WO_3$. In this regard, the doping concentration of the inorganic metal oxide may be, for example, about 0.1 volume % to about 80 volume % based on the total weight of the HIL.

The thickness of the HIL may be, for example, about 10 Å to about 10000 Å, and preferably about 100 Å to about 1000 Å. If the thickness of the HIL is less than about 10 Å, hole injection characteristics may be degraded. On the other hand, if the thickness of the HIL is greater than about 10000 Å, the driving voltage of the organic light emitting device may be increased.

The HTL may be formed using any known method, such as, for example, a vacuum-depositing method, a spin-coating method, a casting method, or a LB deposition method. In this regard, deposition conditions may differ according to the target compound, the target layer structure, and thermal characteristics, but may be the same or similar to those described with reference to the HIL.

A HTL may be formed using any known hole transporting material. Examples of the hole transporting material include but are not limited to: a carbazole derivative such as N-phenylcarbazole or polyvinylcarbazole; an amine derivative having an aromatic condensation ring, such as N,N'-bis(3-methylphenyl)-N,N'-diphenyl-[1,1-biphenyl]-4,4'-diamine (TPD) illustrated below or N,N'-di(naphthalene-1-yl)-N,N'-diphenyl benzidine (α-NPD) illustrated below; and a triphenylamine-based material, such as 4,4',4''-tris(N-carbazolyl) triphenylamine (TCTA). For example, TCTA may have, in addition to a hole transporting capability, a capability of blocking diffusion of excitons generated in the EML.

The thickness of the HTL may be, for example, about 50 Å to about 1000 Å, and preferably about 100 Å to about 600 Å. If the thickness of the HTL is less than about 50 Å, the hole transporting characteristics may be degraded. On the other hand, if the thickness of the HTL is greater than about 1000 Å, the driving voltage of the organic light emitting device may be increased.

The EML may be formed using any known method, such as, for example, a vacuum-depositing method, a spin-coating method, a casting method, or a LB deposition method. In this regard, the deposition conditions and the coating conditions may differ according to the target compound, the target layer structure, and thermal characteristics, but may be the same or similar to those described with reference to the HIL.

The EML may include only a single light emission material. In some cases, however, the EML may include a host and a dopant.

Examples of the host include tris(8-quinolate)aluminum ($Alq_3$), 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI) illustrated below, 3-tert-butyl-9,10-di(naphth-2-yl)anthracene (TBADN) illustrated below, and E3 illustrated below. However, the host can also be other materials.

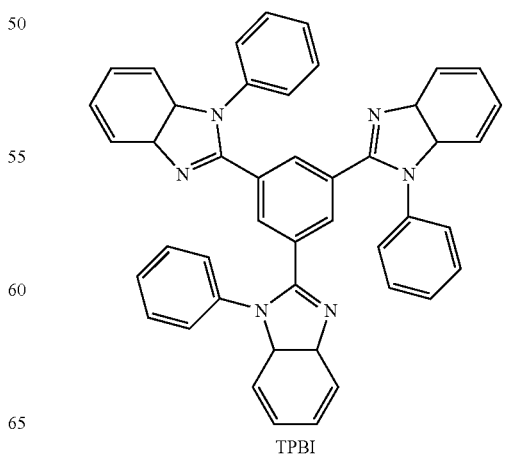

TPBI

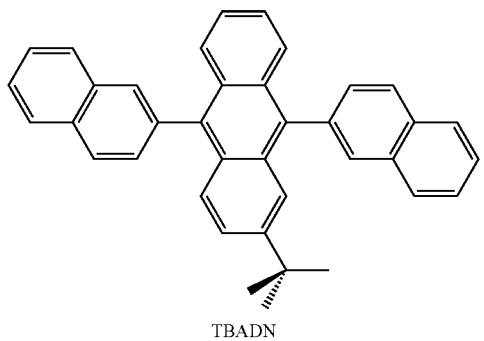

TBADN

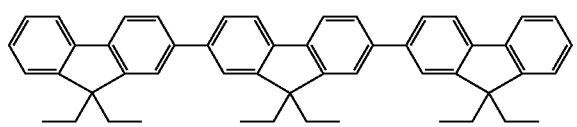

E3

Meanwhile, examples of a known red dopant include PtOEP, Ir(piq)$_3$, and Btp$_2$Ir(acac), which are illustrated below. However, the red dopant may also be other materials.

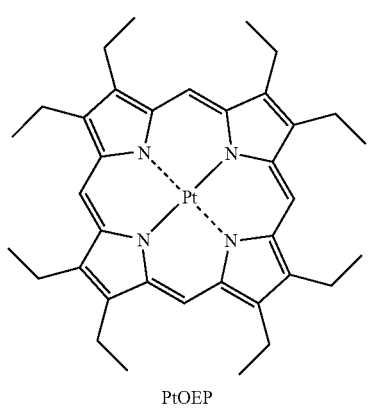

PtOEP

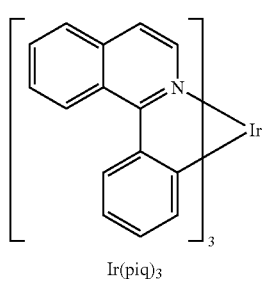

Ir(piq)$_3$

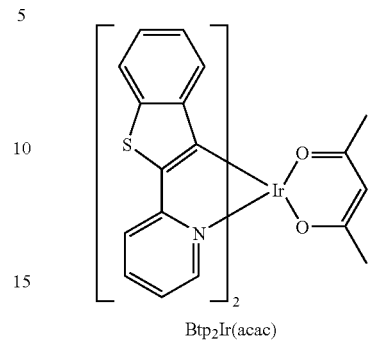

Btp$_2$Ir(acac)

Examples of a known green dopant include Ir(ppy)$_3$ (where ppy=phenylpyridine), Ir(ppy)$_2$(acac), and Ir(mpyp)$_3$ which are illustrated below. However, the green dopant may also be other materials.

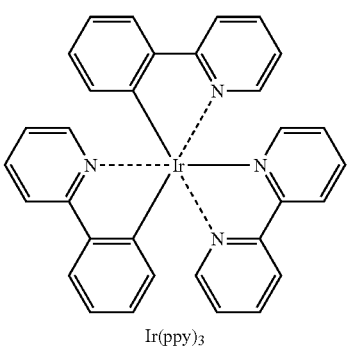

Ir(ppy)$_3$

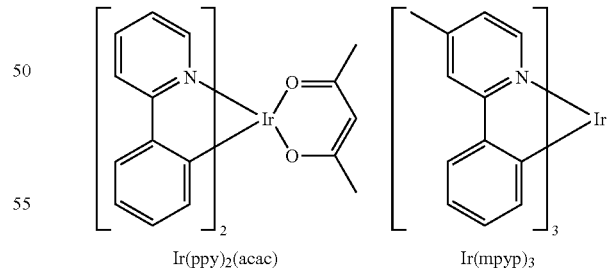

Ir(ppy)$_2$(acac)        Ir(mpyp)$_3$

Examples of a known blue dopant include F$_2$Irpic, (F$_2$ppy)$_2$Ir(tmd), Ir(dfppz)$_3$, ter-fluorene, 4,4'-bis[4-(di-p-tolylamino)styryl]biphenyl (DPAVBi), and 2,5,8,11-tetra-tert-butyl perylene (TBP) which are illustrated below. However, the green dopant can also be other materials.

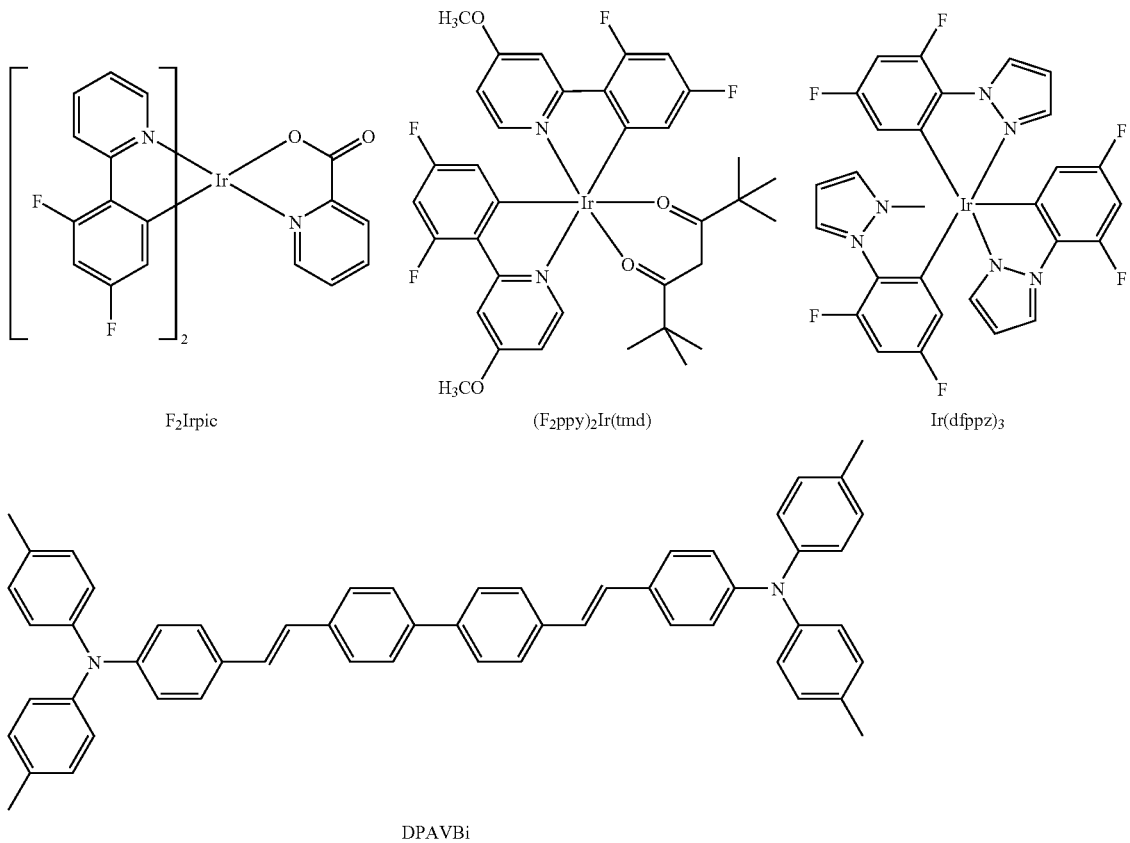

F₂Irpic        (F₂ppy)₂Ir(tmd)        Ir(dfppz)₃

DPAVBi

The thickness of the EML may be, for example, about 100 Å to about 1000 Å, and preferably about 100 Å to about 600 Å. If the thickness of the EML is less than about 100 Å, the emission characteristics of the EML may be degraded. On the other hand, if the thickness of the EML is greater than about 1000 Å, the driving voltage of the organic light emitting device may be increased.

In addition, a HBL may be further formed on the EML. The HBL blocks triplet excitons or holes from diffusing into, for example, a cathode. The HBL may be formed using any known method, such as, for example, a vacuum-depositing method, a spin-coating method, a casting method, or a LB deposition method. In this regard, deposition conditions and coating conditions may differ according to the target compound, the target layer structure, and thermal characteristics, but may be the same or similar to those described with reference to the HIL.

A HBL may be formed using any known hole blocking material. In this regard, examples of the hole blocking material may include, for example, an oxadiazole derivative, a triazole derivative, and a phenanthroline derivative.

The thickness of the hole blocking layer may be, for example, about 50 Å to about 1000 Å, and preferably about 100 Å to about 300 Å. If the HBL is less than about 50 Å, the hole blocking characteristics may be degraded. On the other hand, if the HBL is greater than about 1000 Å, the driving voltage of the organic light emitting device may be increased.

The ETL may be formed using any known method, such as, for example, a vacuum-depositing method, a spin-coating method, a casting method, or a LB deposition method. According to the forming method, the ETL may be formed on the EML or the HBL. In this regard, deposition conditions and coating conditions may differ according to the target compound, the target layer structure, and thermal characteristics, but may be the same or similar to those described with reference to the HIL.

An ETL may be formed using any known electron transporting material. Examples of the electron transporting material include but are not limited to tris(8-quinolinolate)aluminum ($Alq_3$), TAZ, TPQ1, TPQ2, 4,7-diphenyl-1,10-phenanthroline (Bphen), BCP, $BeBq_2$, and BAlq:

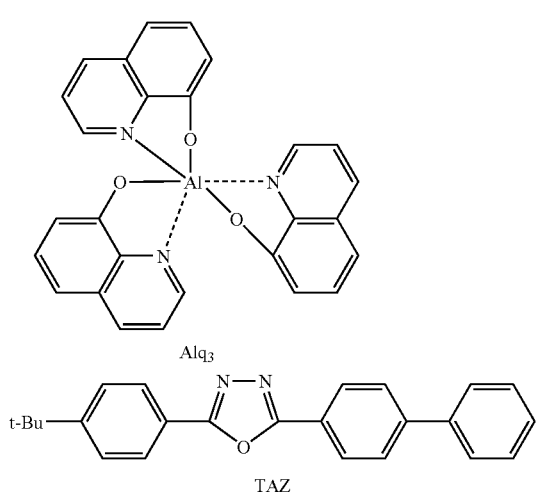

$Alq_3$

TAZ

-continued

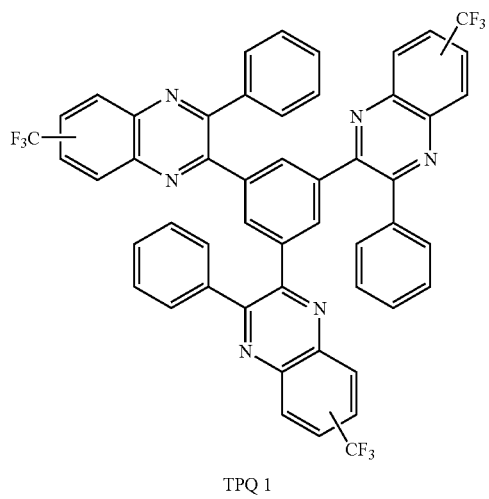

TPQ 1

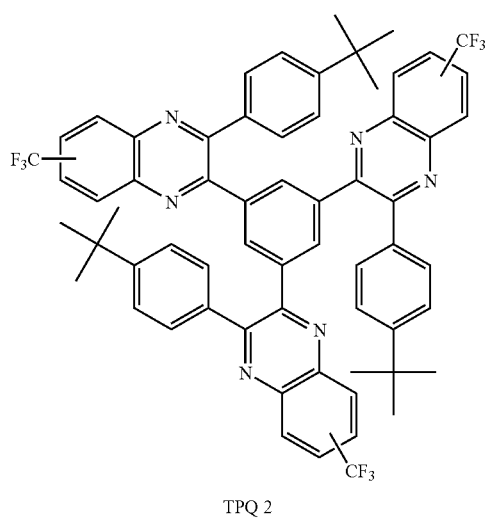

TPQ 2

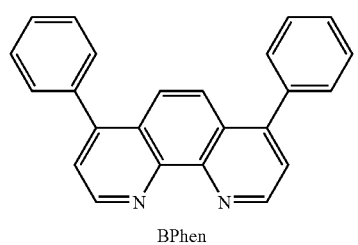

BPhen

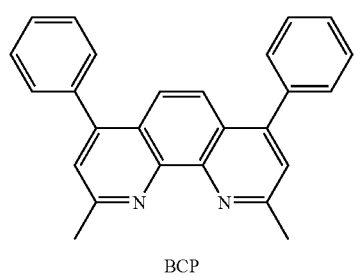

BCP

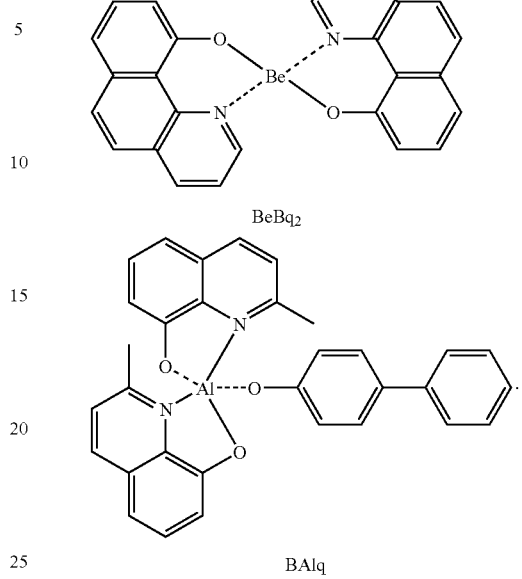

BeBq₂

BAlq

The thickness of the ETL may be, for example, about 100 Å to about 1000 Å, and preferably about 200 Å to about 500 Å. If the thickness of the ETL is less than about 100 Å, the electron transporting characteristics may be degraded. On the other hand, if the thickness of the ETL is greater than about 1000 Å, the driving voltage of the organic light emitting device may be increased. Among these electron transporting materials, BPhen has, in addition to an electron transporting capability, a hole blocking capability.

For example, the EIL may be formed on the ETL by vacuum co-depositing an organic semiconductor material having an electron mobility of about $1\times10^{-6}$ cm²/V·s or more in an electric field of about $1\times10^6$ V/m and a metal azide represented by Formula 1:

$$M(N_3)_x \qquad \text{<Formula 1>}$$

where M is a metal selected from the group consisting of, for example, an alkali metal, alkaline earth metal, and lanthanide-based metal; and x is, for example, 1, 2, or 3.

The EIL may be formed under a vacuum pressure of, for example, about $10^{-10}$ to about $10^{-3}$ torr, and preferably about $10^{-9}$ to about $10^{-6}$ torr. However, the vacuum pressure is not limited to this range.

The electron mobility of the organic semiconductor material may be, for example, $1\times10^{-6}$ cm²/V·s or more, and preferably $1\times10^{-4}$ cm²/V·s or more, in an electric field of $1\times10^6$ V/m. The organic semiconductor material may include an electron transporting material or a host that is used in a conventional EML. Examples of the electron transporting material and the host have already been described above.

Examples of the organic semiconductor material may include tris(8-quinolinolate)aluminum (Alq₃), TAZ, TPQ1, TPQ2, 4,7-diphenyl-1,10-phenanthroline (Bphen), BCP, BeBq₂, BAlq, 4,4'-N,N'-dicarbazole-biphenyl (CBP), 9,10-di (naphthalene-2-yl)anthracene (ADN), 4,4',4''-tris(N-carbazolyl)triphenylamine (TCTA), 1,3,5-tris(N-phenylbenzimidazole-2-yl)benzene (TPBI), 3-tert-butyl-9,10-di(naphth-2-yl)anthracene (TBADN), and E3, but not limited thereto.

In Formula 1, for example, M may be a metal selected from the group consisting of an alkali metal such as Li, Na, K, Rb, Cs or Fr; an alkaline earth metal such as Be, Mg, Ca, Sr, Ba or Ra; and an lanthanide-based metal such as lanthanum (La), cerium (Ce), preseodyminum (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu).

In Formula 1, x is dependent upon M and may be, for example, 1, 2 or 3.

For example, the metal azide may be selected from the group consisting of $NaN_3$, $KN_3$, $RbN_3$, and $CsN_3$. However, the metal azide can also be other materials.

The metal azide represented by Formula 1 has a low deposition temperature, and thus, the metal azide can be simultaneously co-deposited together with the organic semiconductor material in an organic deposition device. Examples of an n-dopant that can be doped on the EIL include but are not limited to metal, metal carbonate, and an organic dopant. However, for metal and metal carbonate, the deposition temperature is high. Accordingly, metal or metal carbonate may not be simultaneously co-deposited with the organic semiconductor material in an organic deposition device, which may cause a need for a separate metal deposition device. Meanwhile, the organic dopant may be chemically unstable and highly reactive and thus, handling the organic dopant in a deposition process may be difficult. However, the metal azide described above, which has a low deposition temperature of, for example, about 350° C. or lower, has a low melting temperature. For example, $CsN_3$ has a melting temperature of about 310° C. and a deposition temperature of about 326° C. Due to low deposition and melting temperatures, the metal azide can be simultaneously co-deposited with the organic semiconductor material described above in a single organic deposition device, without a separate metal deposition device. For example, the vacuum co-deposition temperature of the organic semiconductor material and the metal azide may be about 350° C. or lower, but is not limited thereto. Accordingly, when the metal azie represented by Formula 1 is used together with the organic semiconductor material described above in a single organic deposition device, an EIL having a uniform composition may be readily formed.

When the EIL is formed, the content of the metal azide may be, for example, about 0.2 volume % to about 50 volume % based on the total volume of the EIL, that is, 100 volume %. If the content of the metal azide is less than about 0.2 volume % based on the total volume of the EIL, the importance of electron transporting characteristics may be negligible. On the other hand, if the content of the metal azide is greater than about 50 volume % based on the total volume of the EIL, the metal azide may agglomerate and the doping effect may be decreased.

The thickness of the EIL may be, for example, about 1 Å to about 1000 Å, and preferably about 10 Å to about 500 Å. If the thickness of the EIL is less than 1 Å, the electron injection characteristics may be degraded. On the other hand, if the thickness of the EIL is more than about 1000 Å, the driving voltage of the organic light emitting device may be increased.

As described above, the EIL included in the organic light emitting device according to the current exemplary embodiment may be formed by co-depositing the organic semiconductor material described above and the metal azide represented by Formula 1. The EIL may include, for example, at least one selected from the group consisting of: a metal selected from the group consisting of alkali metal, an alkaline earth metal, and a lanthanide-based metal; a metal oxide selected from the group consisting of alkali metal oxide, alkaline earth metal oxide, and lanthanide-based metal oxide and a metal azide selected from the group consisting of alkali metal azide, alkaline earth metal azid material, and lanthanide-based metal azide. Due to the composition of the EIL described above, the EIL can have beneficial electron injecting capability. Accordingly, electrons and holes can strike a balance in the organic light emitting device and thus, the organic light emitting device may have beneficial electrical characteristics, such as, for example, current density, brightness, and power efficiency.

For example, when an EIL is deposited by co-depositing an organic semiconductor material and a metal azide represented by Formula 1, the metal azide may be thermally decomposed into metal and a nitrogen gas. Accordingly, the EIL may include, for example, a metal selected from the group consisting of alkali metal, alkaline earth metal, and lanthanide-based metal.

In addition, when an EIL is deposited by co-depositing an organic semiconductor material and metal azide represented by Formula 1, a small amount of oxygen may be present in the organic deposition device, even when the organic deposition device is controlled to be in a vacuum condition. Accordingly, the EIL may include a metal oxide selected from the group consisting of alkali metal oxide, alkaline earth metal oxide, and lanthanide-based metal oxide.

Furthermore, when the EIL is formed by co-depositing an organic semiconductor material and a metal azide represented by Formula 1, the EIL may include a metal azide that is not thermally decomposed. Accordingly, the EIL may include, for example, a metal azide selected from the group consisting of alkali metal azide, alkaline earth metal azid material, and lanthanide-based metal azide.

In FIG. 1, the second electrode is disposed on the EIL and can be, for example, a cathode that is an electron injection electrode. The second electrode may be formed by, for example, vacuum depositing or sputtering a known electrode forming material. The second electrode forming material may be, for example, a material having a low work function, such as a metal, an alloy, an electrically conductive compound, or a mixture thereof. Specifically, examples of the second electrode forming material include but are not limited to lithium (Li), magnesium (Mg), aluminum (Al), aluminum-lithium (Al—Li), potassium (Ca), magnesium-indium (Mg—In), and magnesium-silver (Mg—Ag). If the organic light emitting device according to the current exemplary embodiment of the present invention is a top-emission-type light emitting device, a transmissible cathode formed of, for example, indium tin oxide (ITO) or indium zinc oxide (IZO) can be used as the second electrode.

The present invention will be described in further detail with reference to the following examples. These examples are for illustrative purposes only and are not intended to limit the scope of the present invention.

EXAMPLE 1

An organic light emitting device having a structure of glass substrate/ITO(about 150 nm)/NPB(about 10 nm)/TCTA(30 nm)/TCTA:TPBI:Irppy$_3$ (about 30 nm, the doping concentration of Irppy$_3$ was about 5 wt %)/Bphen(about 10 nm)/Bphen: CsN$_3$ (about 20 nm, the concentration of CsN$_3$ was about 20 volume %)/Al(about 200 nm) was manufactured.

First, a transparent electrode substrate coated with indium-tin oxide (ITO) was cleaned. In this case, the thickness of the ITO layer was about 150 nm. Then, the ITO layer was patterned with a photosensitive resin and an etchant to obtain a desired pattern structure and then cleaned. NPB was deposited on the ITO layer to form a HIL having a thickness of about 10 nm, and then TCTA was deposited on the HIL to form a HTL having a thickness of about 30 nm. As TCTA also has an exciton blocking capability, the HTL also performed as an exciton blocking layer. Then, TCTA, TPBI and Irppy$_3$ (the doping concentration of Irppy$_3$ was about 5 wt %) were deposited on the HTL to form an EML having a thickness of about 30 nm. Then, Bphen was deposited on the EML to form an ETL having a thickness of about 10 nm. As Bphen also has an exciton blocking capability, the EML also performed as an exciton blocking layer. Then, Bphen and CsN$_3$ (the concentration of CsN$_3$ was about 20 volume % based on about 100 volume % of the total volume of the EIL) were co-deposited on the ETL in an organic deposition device to form an EIL having a thickness of about 20 nm. In the co-deposition process, the vacuum pressure was about $10^{-7}$ torr, the deposition temperature was about 326° C. Then, Al was deposited on the EIL to form a cathode having a thickness of about 200 nm, thereby completing the manufacture of the organic light emitting device.

EXAMPLE 2

An organic light emitting device having a structure of glass substrate/ITO (about 150 nm)/NPB:MoO$_3$ (about 10 nm, the doping concentration of MoO$_3$ was about 30 volume %)/TCTA(about 30 nm)/TCTA:TPBI:Irppy$_3$ (about 30 nm, the doping concentration of Irppy$_3$ was about 5 wt %)/Bphen(about 10 nm)/Bphen:CsN$_3$ (about 20 nm, the doping concentration of CsN$_3$ was about 20 volume %)/Al (about 200 nm) was manufactured.

First, a transparent electrode substrate coated with indium-tin oxide (ITO) was cleaned. In this case, the thickness of the ITO layer was about 150 nm. Then, the ITO layer was patterned with a photosensitive resin and an etchant to obtain a desired pattern structure and then cleaned. NPB and MoO$_3$ (the doping concentration of MoO$_3$ was about 30 volume %) were deposited on the ITO layer to form a HIL having a thickness of about 10 nm, and then TCTA was deposited on the HIL to form a HTL having a thickness about 30 nm. As TCTA also has an exciton blocking capability, the HTL also performed as an exciton blocking layer. Then, TCTA, TPBI and Irppy$_3$ (the doping concentration of Irppy$_3$ was about 5 wt %) were deposited on the HTL to form an EML having a thickness of about 30 nm. Then, Bphen was deposited on the EML to form an ETL having a thickness of about 10 nm. As Bphen also has an exciton blocking capability, the EML also performed as an exciton blocking layer. Then, Bphen and CsN$_3$ (the concentration of CsN$_3$ was about 20 volume % based on about 100 volume % of the total volume of the EIL) were co-deposited on the ETL in an organic deposition device to form an EIL having a thickness of about 20 nm. Then, Al was deposited on the EIL to form a cathode having a thickness of about 200 nm, thereby completing the manufacture of the organic light emitting device.

Comparative Example 1

An organic light emitting device having a structure of glass substrate/ITO (about 150 nm)/NPB (about 10 nm)/TCTA (about 30 nm)/TCTA:TPBI:Irppy$_3$ (about 30 nm, the doping concentration of Irppy$_3$ was about 5 wt %)/Bphen (about 30 nm)/LiF(1 nm)/Al (about 200 nm) was manufactured.

First, a transparent electrode substrate coated with indium-tin oxide (ITO) was cleaned. In this case, the thickness of the ITO layer was about 150 nm. Then, the ITO layer was patterned with a photosensitive resin and an etchant to obtain a desired pattern structure and then cleaned. NPB was deposited on the ITO layer to form a HIL having a thickness of about 10 nm, and then TCTA was deposited on the HIL to form a HTL having a thickness of about 30 nm. As TCTA also has an exciton blocking capability, the HTL also performed as an exciton blocking layer. Then, TCTA, TPBI and Irppy$_3$ (the doping concentration of Irppy$_3$ was about 5 wt %) were deposited on the HTL to form an EML having a thickness of about 30 nm. Then, Bphen was deposited on the EML to form an ETL having a thickness of about 30 nm. As Bphen also has an exciton blocking capability, the EML also performed as an exciton blocking layer. Then, LiF was deposited on the ETL to form an EIL having a thickness of about 1 nm. Then, Al was deposited on the EIL to form a cathode having a thickness of about 200 nm, thereby completing the manufacture of the organic light emitting device.

Evaluation

Figure 2:
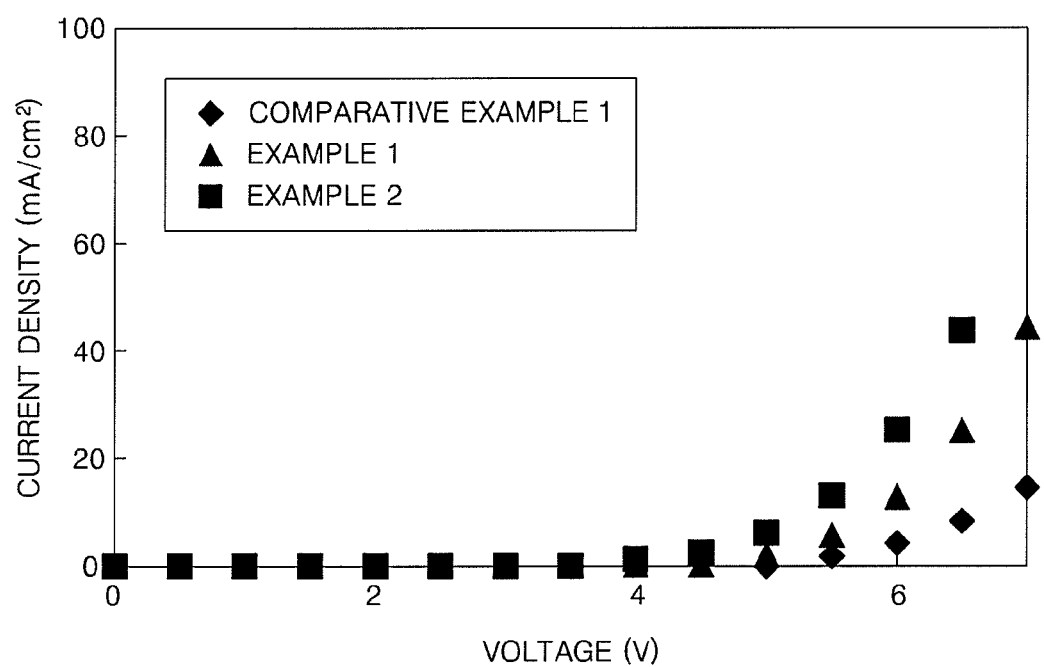
FIG. 2 is a voltage-current density graph of organic light emitting devices prepared according to Example 1, Example 2 and Comparative Example 1.
Figure 3:
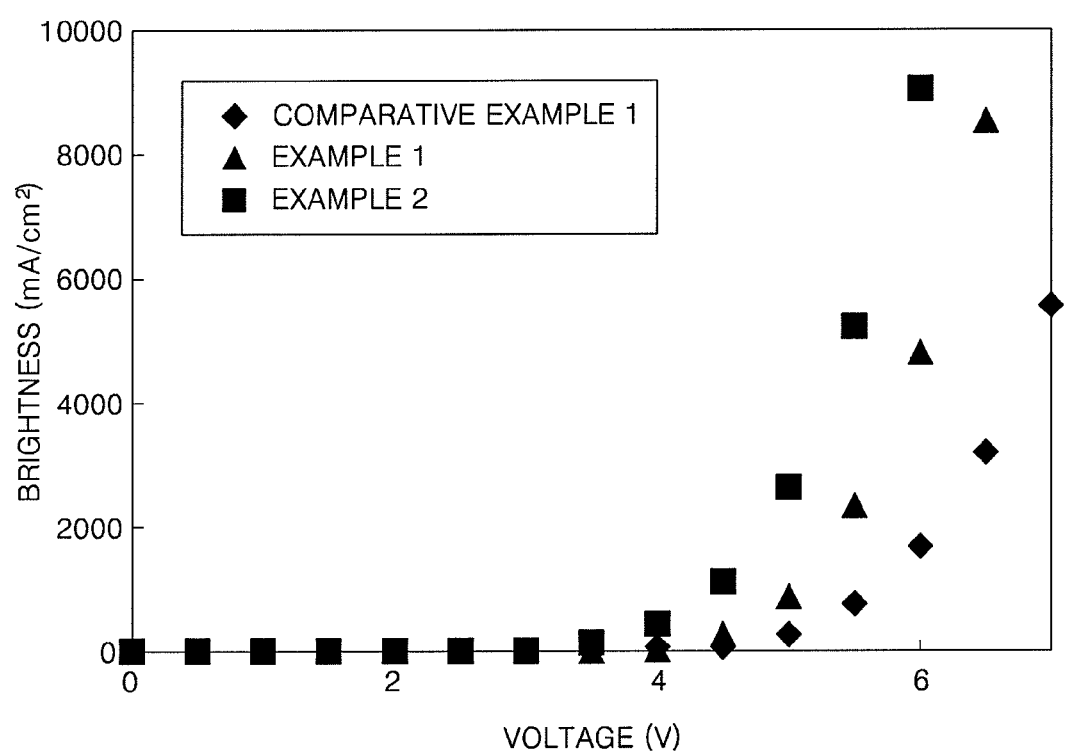
FIG. 3 is a voltage-brightness graph of organic light emitting devices prepared according to Example 1, Example 2 and Comparative Example 1.
Figure 4:
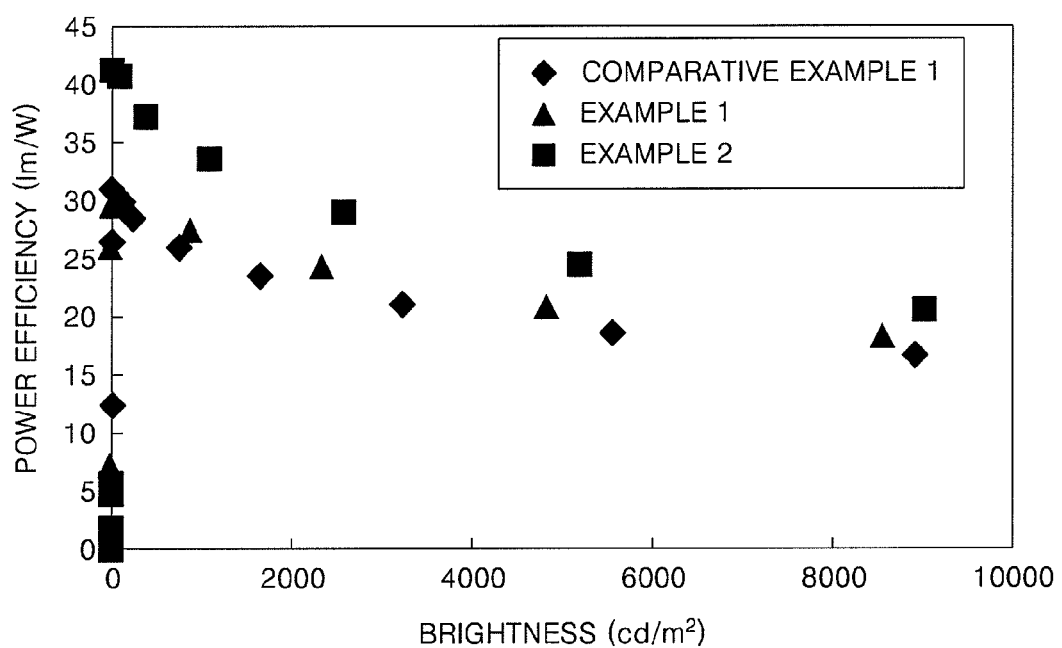
FIG. 4 is a brightness-power efficiency graph of the organic light emitting devices prepared according to Example 1 and Comparative Example 1.

FIG. 2 is a voltage-current density graph of the organic light emitting devices prepared according to Example 1, Example 2 and Comparative Example 1, FIG. 3 is a voltage-brightness graph of the organic light emitting devices prepared according to Example 1, Example 2 and Comparative Example 1, and FIG. 4 is a brightness-power efficiency graph of the organic light emitting devices prepared according to Example 1 and Comparative Example 1. These results were obtained using a Keithley 2400 source equipment unit and a CS 1000 spectrophtometer. Referring to FIGS. 2, 3 and 4, it can be seen that the organic light emitting devices manufactured according to Examples 1 and 2 had higher current density, higher brightness, and higher power efficiency than the organic light emitting device manufactured according to Comparative Example 1.

Having described the exemplary embodiments of the present invention, it is further noted that it is readily apparent to those of reasonable skill in the art that various modifications may be made without departing from the spirit and scope of the invention which defined by the metes and bounds of the appended claims.

What is claimed is:

1. A method of manufacturing an organic light emitting device, comprising:
forming a first electrode on a substrate;
forming an organic layer on the first electrode; and
forming a second electrode on the organic layer, wherein the forming of the organic layer comprises forming an electron injection layer (EIL) by vacuum co-depositing an organic semiconductor material having an electron mobility of about $1\times10^{-6}$ cm$^2$/V·s or more in an electric field of about $1\times10^6$ V/m and a metal azide represented by Formula 1:

$$M(N_3)_x \qquad \text{<Formula 1>}$$

where M is selected from the group consisting of an alkali metal, an alkaline earth metal, and a lanthanide-based metal; and x is 1, 2, or 3.

2. The method of manufacturing an organic light emitting device according to claim 1, wherein the vacuum co-depositing is performed at a pressure of about $10^{-10}$ torr to about $10^{-3}$ torr.

3. The method of manufacturing an organic light emitting device according to claim 1, wherein the vacuum co-depositing is performed at a temperature of about 350° C. or lower.

4. The method of manufacturing an organic light emitting device according to claim 1, wherein the organic semiconductor material comprises an electron transporting material or a host that is used in an emission layer.

5. The method of manufacturing an organic light emitting device according to claim 1, wherein the organic semiconductor material comprises at least one material selected from the group consisting of tris(8-quinolinolate)aluminum(Alq$_3$), TAZ, TPQ1, TPQ2, 4,7-diphenyl-1,10-phenanthroline (Bphen), BCP, BeBq$_2$, BAlq, 4,4'-N,N'-dicarbazole-biphenyl (CBP), 9,10-di(naphthalene-2-yl)anthracene(ADN), 4,4 ', 4"-tris(N-carbazolyl)triphenylamine (TCTA), 1,3,5-tris(N-phenylbenzimidazole-2-yl)benzene (TPBI), 3-tert-butyl-9,10-di(napth-2-yl) anthracene (TBADN), and E3:

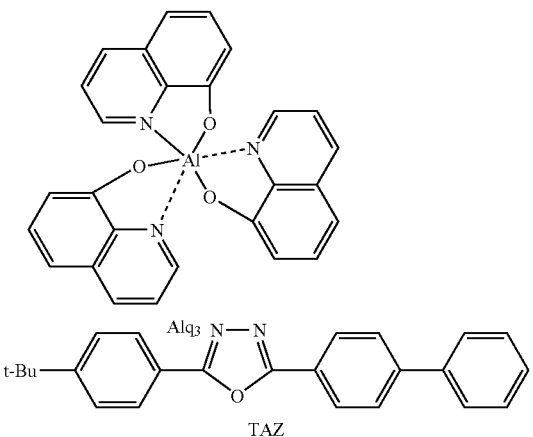

Alq$_3$

TAZ

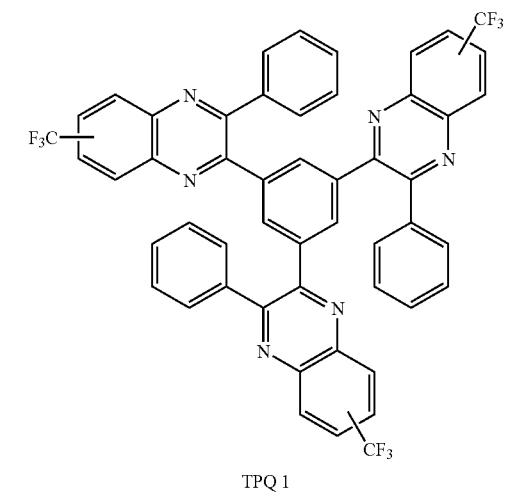

TPQ 1

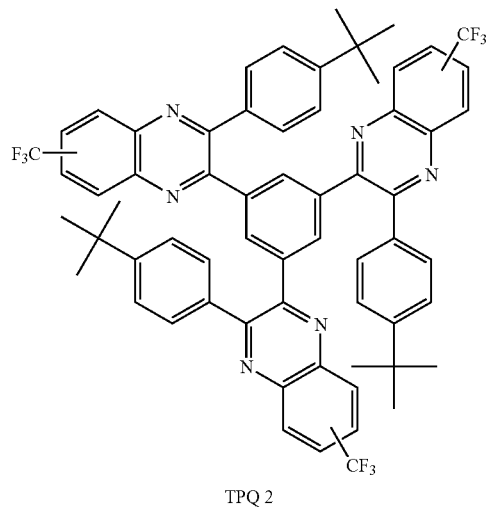

TPQ 2

-continued

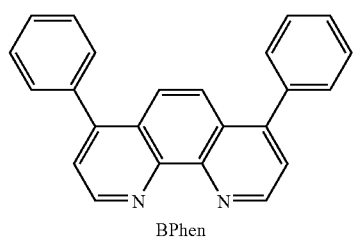

BPhen

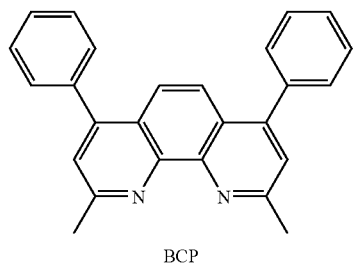

BCP

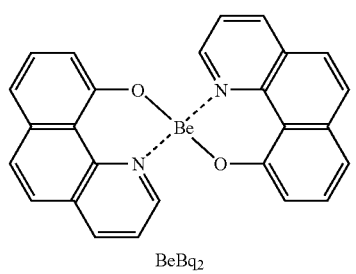

BeBq$_2$

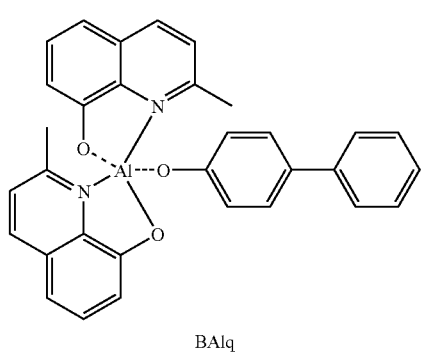

BAlq

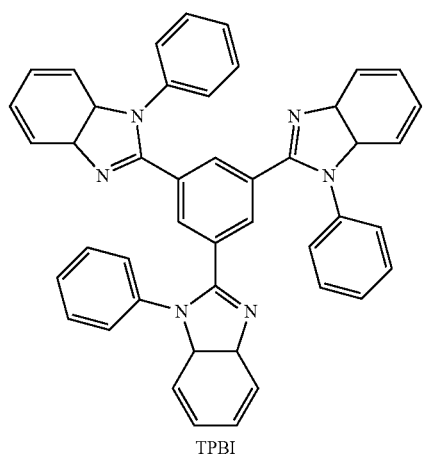

TPBI

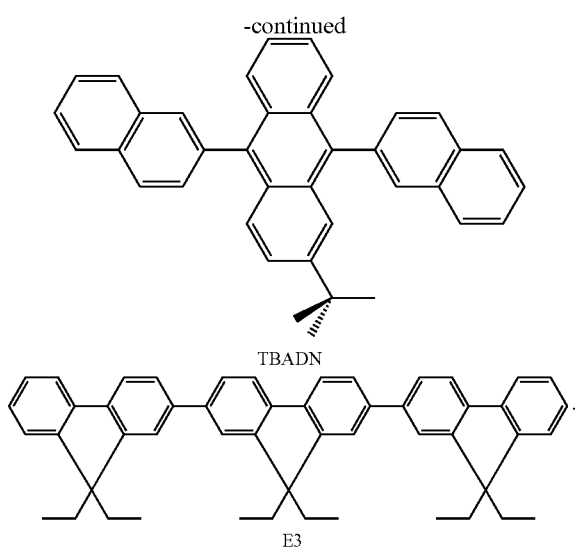

TBADN

E3

6. The method of manufacturing an organic light emitting device according to claim 1, wherein the metal azide is selected from the group consisting of $NaN_3$, $KN_3$, $RbN_3$, and $CsN_3$.

7. The method of manufacturing an organic light emitting device according to claim 1, wherein the organic semiconductor material and the metal azide are simultaneously vacuum co-deposited in an organic deposition device.

8. The method of manufacturing an organic light emitting device according to claim 1, wherein the content of the metal azide is about 0.2 volume% to about 50 volume% based on the total volume of the EIL.

9. The method of manufacturing an organic light emitting device according to claim 1, wherein the forming of the organic layer further comprises forming a hole injection layer by co-depositing an inorganic semiconductor material and an organic hole injectable material, wherein
the inorganic semiconductor material is selected from the group consisting of $MoO_3$, $V_2O_5$ and $WO_3$.

10. An organic light emitting device comprising: a substrate; a first electrode; a second electrode; and an organic layer interposed between the first electrode and the second electrode, wherein
the organic layer comprises an electron injection layer (EIL), wherein
the EIL is formed by vacuum co-depositing an organic semiconductor material having an electron mobility of about $1 \times 10^{-6}$ cm$^2$/V·s or more in an electric field of about $1 \times 10^6$ V/m and a metal azide represented by Formula 1:

$M(N_3)_x$ <Formula 1> where M is selected from the group consisting of an alkali metal, an alkaline earth metal, and a lanthanide-based metal; and
x is 1, 2, or 3.

11. The organic light emitting device of claim 10, wherein the organic semiconductor material comprises an electron transporting material or a host that is used in an emission layer.

12. The organic light emitting device of claim 10, wherein the organic semiconductor material comprises at least one material selected from the group consisting of tris(8-quinolinolate)aluminum (Alq$_3$), TAZ, TPQ1, TPQ2, 4,7-diphenyl-1, 10-phenanthroline (Bphen), BCP, BeBq$_2$, BAlq, 4,4'-N,N'-dicarbazole-biphenyl (CBP), 9,10-di(naphthalene-2-yl)anthracene (ADN), 4,4',4''-tris(N-carbazolyl)triphenylamine (TCTA), 1,3,5-tris(N-phenylbenzimidazole -2-yl)benzene (TPBI), 3-tert-butyl-9,10-di(naphth-2-yl)anthracene (TBADN), and E3:

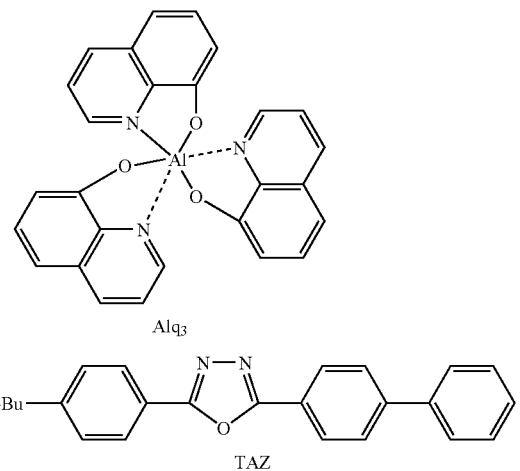

Alq$_3$

TAZ

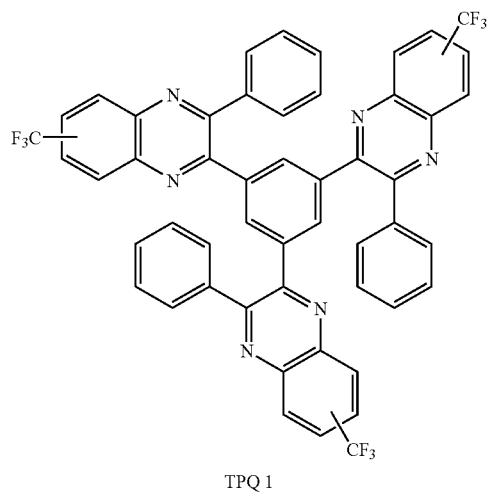

TPQ 1

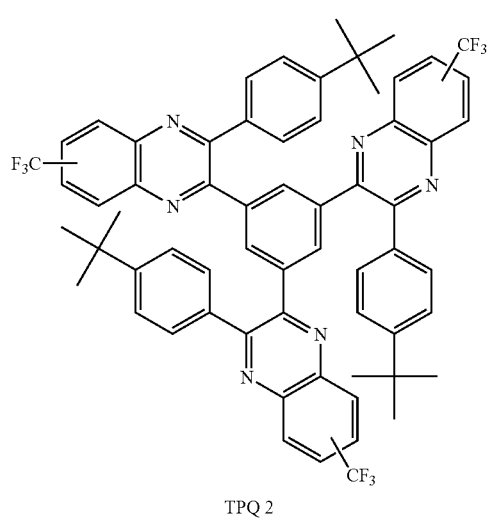

TPQ 2

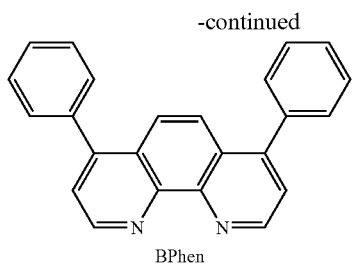
BPhen

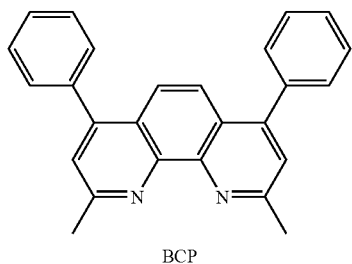
BCP

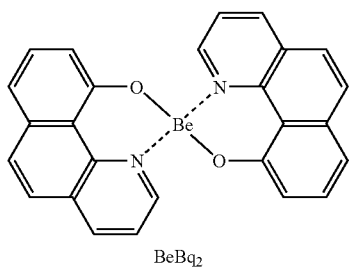
BeBq₂

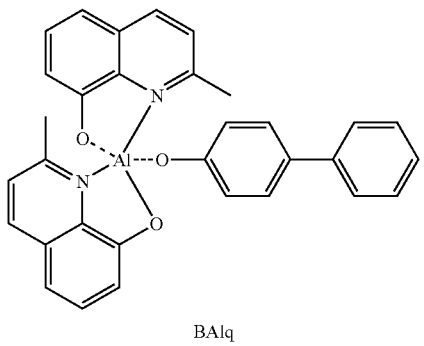
BAlq

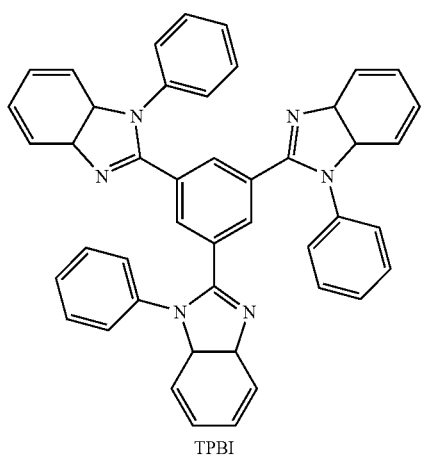
TPBI

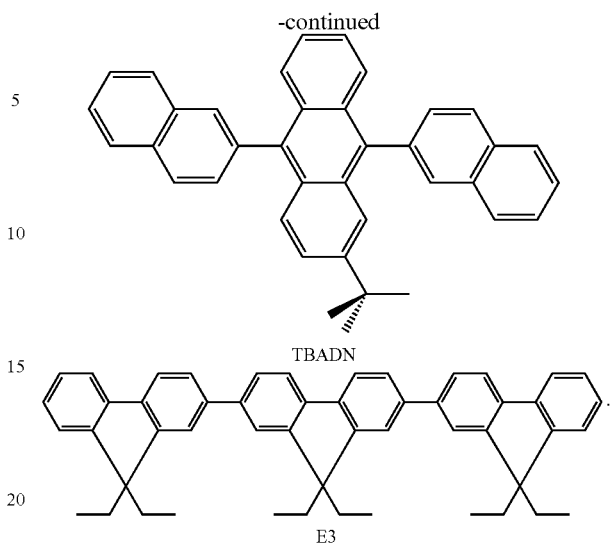
TBADN

E3

13. The organic light emitting device of claim 10, wherein the metal azide is selected from the group consisting of NaN$_3$, KN$_3$, RbN$_3$ and CsN$_3$.

14. The organic light emitting device of claim 10, wherein the EIL comprises at least one material selected from the group consisting of: a metal, a metal oxide and a metal azide.

15. The organic light emitting device of claim 10, wherein the organic layer further comprises a hole injection layer comprising an inorganic semiconductor material and an organic hole injectable material, wherein
the inorganic semiconductor material is selected from the group consisting of MoO$_3$, V$_2$O$_5$, and WO$_3$.

16. The organic light emitting device of claim 14, wherein the metal is selected from the group consisting of an alkali metal, an alkaline earth metal, and a lanthanide-based metal, the metal oxide is selected from the group consisting of an alkali metal oxide, an alkaline earth metal oxide, and a lanthanide-based metal oxide; and the metal azide is selected from the group consisting of an alkali metal azide, an alkaline earth metal azid, and an lanthanide-based metal azide.

17. A method of manufacturing an organic light emitting device, comprising:
    forming a first electrode on a substrate;
    forming a hole injection layer (HIL) on the first electrode;
    forming a hole transport layer (HTL) on the HIL;
    forming an emission layer (EML) on the HIL;
    forming an electron transport layer (ETL) on the EML;
    forming an electron injection layer (EIL) on the ETL; and
    forming a second electrode on the EIL, wherein
    the EIL is formed by vacuum co-depositing an organic semiconductor material having an electron mobility of about $1\times10^{-6}$ cm$^2$/V·s or more in an electric field of about $1\times10^6$ V/m and a metal azide represented by Formula 1:

$$M(N_3)_x \qquad \text{<Formula 1>}$$

where M is selected from the group consisting of an alkali metal, an alkaline earth metal, and a lanthanide-based metal; and
x is 1, 2, or 3.

18. The method of manufacturing an organic light emitting device according to claim 17, wherein the EIL is formed by co-depositing 4,7-diphenyl-1,10-phenanthroline (Bphen) and CsN$_3$ on the ETL:

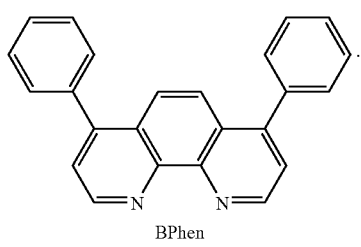
BPhen
19. The method of manufacturing an organic light emitting device according to claim 17, wherein the vacuum co-depositing is performed at a pressure of $10^{-10}$ torr to $10^{-10}$ torr.
20. The method of manufacturing an organic light emitting device according to claim 17, wherein the vacuum co-depositing is perfoinied at a temperature of 350° C. or lower.
* * * * *